(12) United States Patent
Matsubara et al.

(10) Patent No.: US 8,461,925 B2
(45) Date of Patent: Jun. 11, 2013

(54) DISTORTION COMPENSATING APPARATUS, AMPLIFYING APPARATUS, TRANSMITTING APPARATUS, AND DISTORTION COMPENSATING METHOD

(75) Inventors: Satoshi Matsubara, Kawasaki (JP); Shuya Hirata, Kawasaki (JP); Takeshi Ohba, Kawasaki (JP); Hideharu Shako, Kawasaki (JP); Jun Sugiyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 99 days.

(21) Appl. No.: 13/005,747

(22) Filed: Jan. 13, 2011

(65) Prior Publication Data
US 2011/0227644 A1    Sep. 22, 2011

(30) Foreign Application Priority Data

Mar. 17, 2010    (JP) ................................. 2010-061656

(51) Int. Cl.
*H03F 1/26*    (2006.01)
(52) U.S. Cl.
USPC .......................... 330/149; 375/296; 455/114.3
(58) Field of Classification Search
USPC .................. 330/149; 455/114.3; 375/296, 297
See application file for complete search history.

(56) References Cited

U.S. PATENT DOCUMENTS

| 4,700,151 | A | 10/1987 | Nagata |
| 6,998,909 | B1 | 2/2006 | Mauer |
| 2004/0208259 | A1 | 10/2004 | Hunton |
| 2005/0253652 | A1* | 11/2005 | Song et al. .................... 330/149 |
| 2006/0209983 | A1* | 9/2006 | Shako et al. .................. 375/296 |
| 2008/0204136 | A1 | 8/2008 | Nagatani et al. |

FOREIGN PATENT DOCUMENTS

| EP | 1 703 688 | 9/2006 |
| JP | 2006-253749 | 9/2006 |
| JP | 2006-261969 | 9/2006 |
| WO | 00/08870 | 2/2000 |
| WO | 00/72438 | 11/2000 |
| WO | 01/08296 | 2/2001 |
| WO | 2007-036990 | 4/2007 |
| WO | 2009/125323 | 10/2009 |

OTHER PUBLICATIONS

European Search Report dated Aug. 3, 2011, from corresponding European Application No. 11 15 2187.
Korean Notice of Preliminary Rejection dated Jan. 12, 2012, from corresponding Korean Application No. 10-2011-3863.

* cited by examiner

*Primary Examiner* — Robert Pascal
*Assistant Examiner* — Khiem Nguyen
(74) *Attorney, Agent, or Firm* — Katten Muchin Rosenman LLP

(57) ABSTRACT

A distortion compensating apparatus that compensates signal distortion caused by an amplifier includes a distortion compensating process unit that using a distortion compensation coefficient, compensates distortion of an input signal; a memory unit that stores the distortion compensation coefficient; and an address generating unit that generates a first address that is based on electrical power of the input signal and for acquiring the distortion compensation coefficient from the memory unit and that generates a second address that is based on a phase of the input signal and for acquiring the distortion compensation coefficient from the memory unit. The distortion compensating process unit acquires the distortion compensation coefficient from the memory unit based on the first and the second addresses to compensate the distortion.

13 Claims, 14 Drawing Sheets

US 8,461,925 B2

DISTORTION COMPENSATING APPARATUS, AMPLIFYING APPARATUS, TRANSMITTING APPARATUS, AND DISTORTION COMPENSATING METHOD

CROSS REFERENCE TO RELATED APPLICATIONS

This application is based upon and claims the benefit of priority of the prior Japanese Patent Application No. 2010-061656, filed on Mar. 17, 2010, the entire contents of which are incorporated herein by reference.

FIELD

The embodiments discussed herein are related to signal distortion compensation.

BACKGROUND

In recent years, highly efficient transmission through digitization is achieved in radio communication, such as wideband code division multiple access (W-CDMA). When a scheme of multi-level phase modulation is applied in radio communication, a technique is adopted by which the amplification characteristics of a transmission-use electronic amplifier at the transmission-side are linearized to suppress nonlinear distortion and reduce electrical power leakage to adjacent channels. If electrical power efficiency is improved using an amplifier inferior in linearity, a technique for compensating nonlinear distortion of signals is adopted (see, e.g., Japanese laid-Open Patent Publication No. 2006-253749 and International Publication Pamphlet No. 2007/036990).

The conventional techniques, however, pose a problem of difficulty in accurately compensating signal distortions. For example, in mobile communication, such as W-CDMA, a transmitting apparatus uses great electrical power for transmission, which causes significant nonlinear distortion of the transmission signal, raising a side lobe of the frequency spectrum of the transmission signal and thereby, leading to a leak of electrical power of the transmission signal to adjacent channels. Such electrical power leakage creates noise, which deteriorates the communication quality of adjacent channels. If a wideband signal is used as a transmission signal, in particular, a memory effect becomes larger than in the case of using a narrowband signal. A larger memory effect results in difficulty in compensating distortion near the transmission signal caused by the memory effect.

SUMMARY

According to an aspect of an embodiment, a distortion compensating apparatus that compensates signal distortion caused by an amplifier includes a distortion compensating process unit that using a distortion compensation coefficient, compensates distortion of an input signal; a memory unit that stores the distortion compensation coefficient; and an address generating unit that generates a first address that is based on electrical power of the input signal and for acquiring the distortion compensation coefficient from the memory unit and that generates a second address that is based on a phase of the input signal and for acquiring the distortion compensation coefficient from the memory unit. The distortion compensating process unit acquires the distortion compensation coefficient from the memory unit based on the first and the second addresses to compensate the distortion.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of the present invention will be explained with reference to the accompanying drawings. The technique disclosed herein uses a lookup table of distortion compensation coefficients that are associated with addresses through phase differences. By using the lookup table, a proper distortion compensation coefficient is selected according to the phase difference of a signal, whereby accurate compensation of nonlinear distortion of the signal caused by a memory effect of an amplifier is achieved.

Figure 1:
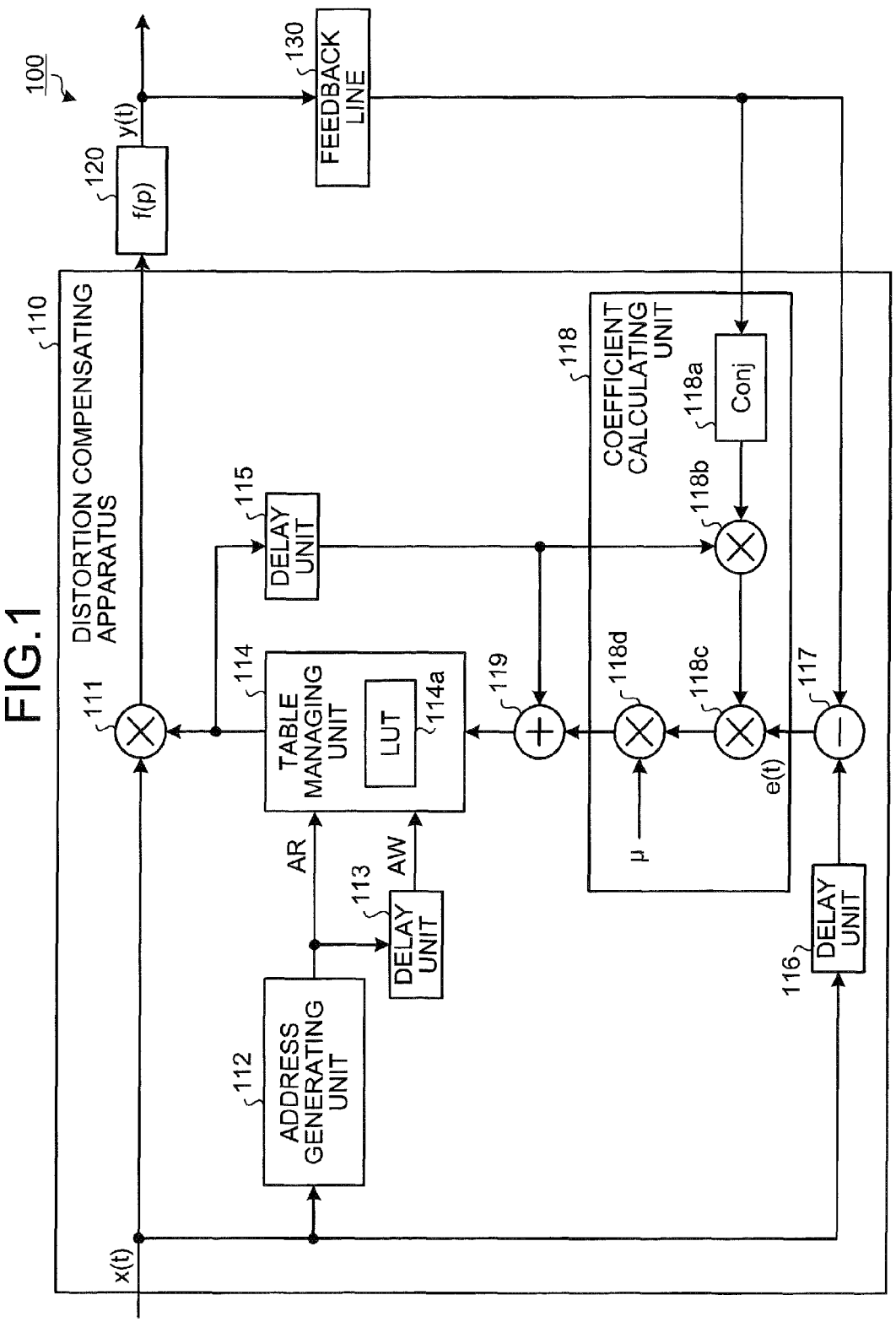
FIG. 1 is a block diagram of an example of a distortion compensating apparatus according to a first embodiment.

FIG. 1 is a block diagram of an example of a distortion compensating apparatus according to a first embodiment. As depicted in FIG. 1, an amplifying apparatus 100 includes a distortion compensating apparatus 110, an amplifier 120, and a feedback line 130. Using, for example, the adaptive least mean square (LMS) algorithm, the distortion compensating apparatus 110 compensates signal distortion caused by the amplifier 120.

As depicted in FIG. 1, the distortion compensating apparatus 110 includes a multiplying unit 111, an address generating unit 112, a delay unit 113, a table managing unit 114, a delay unit 115, a delay unit 116, a subtracting unit 117, a coefficient calculating unit 118, and an adding unit 119. In the following description, x, y, f, h, u, and e each denote a complex number, * denotes a conjugate complex number, and t denotes time.

A signal x(t) input to the distortion compensating apparatus 110 is input to the multiplying unit 111, to the address generating unit 112, and to the delay unit 116. The multiplying unit 111 is a distortion compensating process unit that uses a distortion compensation coefficient to compensate distortion of the signal. Specifically, the multiplying unit 111 multiplies the input signal x(t) by a distortion compensation coefficient hn−1(p) output from the table managing unit 114 and outputs the resulting signal to the amplifier 120.

The amplifier 120 has a nonlinear distortion function f(p) as an amplification property, and amplifies the signal output from the multiplying unit 111. The amplifier 120 outputs the amplified signal y(t) (=hn−1(p)x(t)f(p)). The signal y(t) from the amplifier 120 is output downstream and part of the signal y(t) is branched as a feedback signal y(t) to the feedback line 130.

The feedback line 130 is a circuit that feeds back the feedback signal y(t) that is a branch of the signal y(t) from the amplifier 120. For example, the feedback line 130 converts the feedback signal y(t) that is a branch of the signal y(t) from the amplifier 120, into a digital signal by frequency conversion and quadrature wave detection, and outputs the digitized feedback signal y(t) to the subtracting unit 117 and to the coefficient calculating unit 118.

The address generating unit 112 generates, based on the electrical power of the input signal, a first address for acquiring a distortion compensation coefficient from the table managing unit 114. The address generating unit 112 also generates, based on the phase of the input signal, a second address for acquiring a distortion compensation coefficient from the table managing unit 114.

Specifically, the address generating unit 112 calculates the power p (=x2(t)) of the input signal x(t), and generates an address uniquely corresponding to the calculated power p as an X-axis direction address (first address). The address generating unit 112 calculates a phase difference Δ between different points of time of the signal x(t), and generates an address uniquely corresponding to the calculated phase difference Δ as a Y-axis direction address (second address).

The address generating unit 112 generates a synthesized address by synthesizing an X-axis direction address and a Y-axis direction address. The synthesized address is, for example, an address that uniquely corresponds to a combination of the X-axis direction address and the Y-axis direction address. For example, the address generating unit 112 generates the synthesized address made up of the X-axis direction address and the Y-axis direction address arranged as "X-axis direction address:Y-axis direction address". The synthesized address generated by the address generating unit 112 is output to the delay unit 113 and is further output as a read-in address AR to the table managing unit 114.

The delay unit 113 delays the synthesized address output from the address generating unit 112 and outputs the delayed synthesized address as a write-in address AW to the table managing unit 114. The delay rate at the delay unit 113 is set based on the calculation period needed to acquire an updated value for a lookup table (LUT) 114a by the subtracting unit 117 and the coefficient calculating unit 118. Hence, the synthesized address output from the address generating unit 112 can be used as the write-in address AW.

The table managing unit 114 is a memory unit that stores distortion compensation coefficients calculated by the subtracting unit 117 and the coefficient calculating unit 118. Specifically, the table managing unit 114 stores the LUT 114a that associates distortion compensation coefficients with two-dimensional addresses. A distortion compensation coefficient is a coefficient that is used in distortion compensation by the multiplying unit 111. A two-dimensional address is an address that is a combination of an X-axis direction address and a Y-axis direction address.

The table managing unit 114 acquires the X-axis direction address and the Y-axis direction address from the read-in address AR output from the address generating unit 112, and reads out a distortion compensation coefficient associated with the acquired X-axis direction address and the Y-axis direction address from the LUT 114a. The table managing unit 114 outputs the read distortion compensation coefficient hn−1(p) to the multiplying unit 111 and to the delay unit 115.

The table managing unit 114 acquires the X-axis direction address and the Y-axis direction address from the write-in address AW output from the delay unit 113. The table managing unit 114 then writes an updated distortion compensation coefficient value output from the adding unit 119, to an area of the LUT 114a that corresponds to the acquired X-axis direction address and the Y-axis direction address.

The delay unit 115 delays the distortion compensation coefficient hn−1(p) output from the table managing unit 114 and outputs the delayed distortion compensation coefficient hn−1(p) to the coefficient calculating unit 118 and to the adding unit 119. The delay unit 116 delays the input signal x(t) and outputs the delayed input signal x(t) to the subtracting unit 117.

The subtracting unit 117 and the coefficient calculating unit 118 is a calculating unit that based on the input signal not yet subject to distortion compensation by the multiplying unit 111 and an output signal from the amplifier 120, calculates a distortion compensation coefficient. Specifically, the subtracting unit 117 outputs to the coefficient calculating unit 118, the difference e(t) of the feedback signal y(t) output from the feedback line 130 and the signal x(t) output from the delay unit 116. The coefficient calculating unit 118 calculates an updated value for a distortion compensation coefficient stored in the LUT 114a of the table managing unit 114. Specifically, the coefficient calculating unit 118 has a conjugate complex signal output unit (Conj) 118a and multiplying units 118b to 118d.

The conjugate complex signal output unit 118a outputs to the multiplying unit 118b, a conjugate complex signal y*(t) of the feedback signal y(t) from the feedback line 130. The multiplying unit 118b outputs to the multiplying unit 118c, the product u*(t) (=hn−1(p)y*(t)) of the distortion compensation coefficient hn−1(p) from the delay unit 115 and the conjugate complex signal y*(t) from the conjugate complex signal output unit 118a.

The multiplying unit 118c outputs to the multiplying unit 118d, the product e(t)u*(t) of the difference e(t) from the subtracting unit 117 and the multiplication result u*(t) from the multiplying unit 118b. The multiplying unit 118d outputs to the adding unit 119, the product μe(t)u*(t) of the multiplication result e(t)u*(t) from the multiplying unit 118c and a step size parameter μ.

The adding unit 119 adds the distortion compensation coefficient hn−1(p) from the delay unit 115 and the multiplication result μe(t)u*(t) from the multiplying unit 118d and outputs to the table managing unit 114, the sum hn−1(p)+μe(t)u*(t) as an updated value for the LUT 114a. The updated value output from the adding unit 119 is written to an area of the LUT 114a that corresponds to the write-in address AW input to the table managing unit 114.

The delay time at each of the delay units 113, 115, and 116 is determined to be, for example, a time D from the point that the signal x(t) enters the distortion compensating apparatus 110 to the point that the feedback signal y(t) enters the subtracting unit 117. Specifically, when a signal delay time at the amplifier 120 is D0 and a signal delay time at the feedback line 130 is D1, each delay time at the delay units 113, 115, and 116 is determined to be D0+D1.

As a result, for the write-in address AW input to the table managing unit 114, a distortion compensation coefficient in the LUT 114a of the table managing unit 114 is updated to a distortion compensation coefficient h(p) that minimizes the difference signal e(t) representing the difference e(t) between the signal x(t) and the feedback signal y(t). The distortion compensation coefficient thus converges to an optimum distortion compensation coefficient, by which signal distortion by the amplifier 120 is compensated.

In this manner, based on the X-axis direction address and the Y-axis direction address to carry out distortion compensation, a distortion compensation coefficient is acquired from the LUT 114a of the table managing unit 114, thereby enabling control of nonlinear distortion to reduce electrical power leakage to adjacent channels.

Although, the described configuration is such that the address generating unit 112 generates and outputs a synthesized address that is a synthesis of an X-axis direction address and a Y-axis direction address, a configuration other than such configuration is applicable provided the configuration enables the table managing unit 114 to acquire the X-axis direction address and the Y-axis direction address. For example, the configuration may be such that the address generating unit 112 outputs both the X-axis direction address and the Y-axis direction address.

Figure 2:
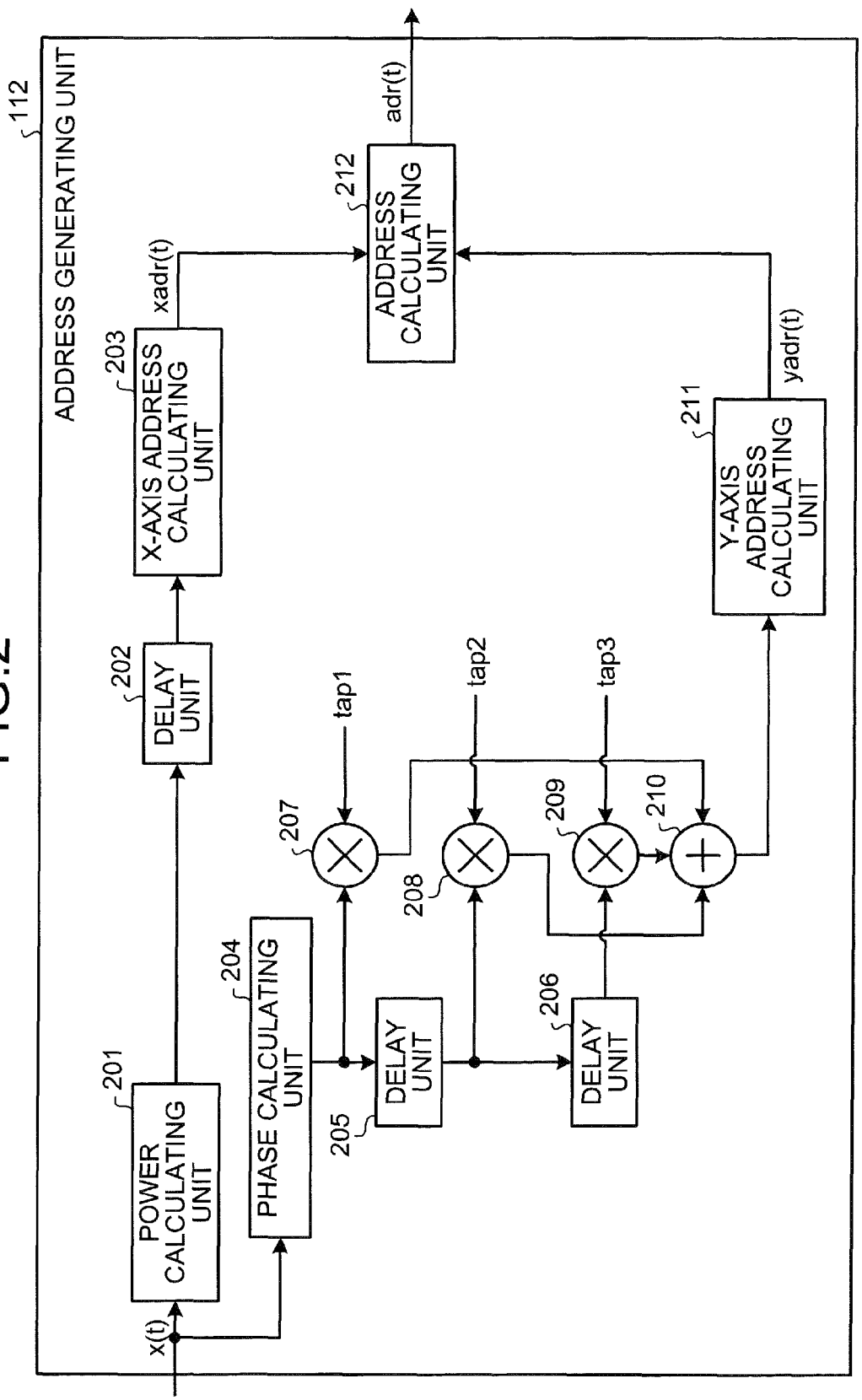
FIG. 2 is a block diagram of an example of an address generating unit depicted in FIG. 1.

FIG. 2 is a block diagram of an example of the address generating unit depicted in FIG. 1. As depicted in FIG. 2, the address generating unit 112 includes a power calculating unit 201, a delay unit 202, an X-axis address calculating unit 203, a phase calculating unit 204, delay units 205 and 206, multiplying units 207 to 209, an adding unit 210, a Y-axis address calculating unit 211, and an address calculating unit 212. The signal x(t) input to the address generating unit 112 is input to the power calculating unit 201 and to the phase calculating unit 204.

The power calculating unit 201, the delay unit 202, and the X-axis address calculating unit 203 generate based on the electrical power (power) of the input signal x(t), the first address for acquiring a distortion compensation coefficient from the table managing unit 114.

Specifically, the power calculating unit 201 calculates the power p (=x2(t)) of the input signal x(t). The power calculating unit 201 outputs power information indicative of the calculated power p to the delay unit 202. The delay unit 202 delays the power information output from the power calculating unit 201 by one sample and outputs the delayed power information to the X-axis address calculating unit 203. The X-axis address calculating unit 203 normalizes the power information output from the delay unit 202 to calculate the X-axis direction address and outputs the calculated X-axis direction address xadr(t) to the address calculating unit 212.

The phase calculating unit 204, the delay units 205 and 206, the multiplying units 207 to 209, the adding unit 210, and the Y-axis address calculating unit 211 generate based on the phase of the input signal, the second address for acquiring a distortion compensation coefficient from the table managing unit 114.

The phase calculating unit 204 calculates the phase θ of the input signal x(t). If the phase calculating unit 204 is implemented in the form of hardware, the cordic method and the table lookup method are used as a method of calculating the phase θ. If the phase calculating unit 204 is implemented in the form of software, an integrated phase calculation function may be adopted, in addition to the cordic method and the table lookup method. The phase calculating unit 204 outputs to the delay unit 205 and to the multiplying unit 207, phase information indicative of the calculated phase θ.

The delay unit 205 delays the phase information output from the phase calculating unit 204 by one sample and outputs the delayed phase information to the delay unit 206 and to the multiplying unit 208. The delay unit 206 delays the phase information output from the delay unit 205 by one sample and outputs the delayed phase information to the multiplying unit 209.

The multiplying unit 207 multiplies the phase information output from the phase calculating unit 204 by a tap coefficient tap1 and outputs the resulting phase information to the adding unit 210. The multiplying unit 208 multiplies the phase information output from the delay unit 205 by a tap coefficient tap2 and outputs the resulting phase information to the adding unit 210. The multiplying unit 209 multiplies the phase information output from the delay unit 206 by a tap coefficient tap3 and outputs the resulting phase information to the adding unit 210.

The adding unit 210 sums the signals output from the multiplying units 207 to 209. The sum obtained by the adding unit 210 represents the phase differences Δθ between three different points of time (e.g., past, present, and future) of the signal x(t). While a case of calculating the phase differences Δθ between three points of time is described, phase differences Δθ between other points of time, such as two or four points of time, may also be calculated. The adding unit 210 outputs the sum as phase difference information to the Y-axis address calculating unit 211.

The Y-axis address calculating unit 211 normalizes the phase difference information output from the adding unit 210 to calculate a Y-axis direction address. The Y-axis address calculating unit 211 outputs the calculated Y-axis direction address yadr(t) to the address calculating unit 212. In this manner, the Y-axis direction address (second address) is generated based on the difference between the phase calculated by the phase calculating unit 204 and the phase consequent to delaying the calculated phase by a given period of time (e.g., one sample).

The address calculating unit 212 synthesizes the X-axis direction address xadr(t) output from the X-axis address calculating unit 203 and the Y-axis direction address yadr(t) output from the Y-axis address calculating unit 211 to output a synthesized address adr(t). The synthesized address adr(t) output by the address calculating unit 212 is output to the delay unit 113 and is further output as the read-in address AR to the table managing unit 114.

The delay rate at each of the delay units 202, 205, and 206 is not limited to a delay time equivalent to one sample of the signal x(t). For example, the delay rate at each of the delay units 202, 205, and 206 may be determined to be a delay time equivalent to ½ or 2 times one sample of the signal x(t).

For example, the delay rate at each of the delay units 202 and 205 is set so that the power information output from the power calculating unit 201 and the phase information output from the multiplying unit 208 are of the same timing. As a result, the phase information output from the multiplying unit 208 is used as a reference for the Y-axis direction address to match the output timing of the Y-axis direction address and the output timing of the X-axis direction address.

Figure 3:
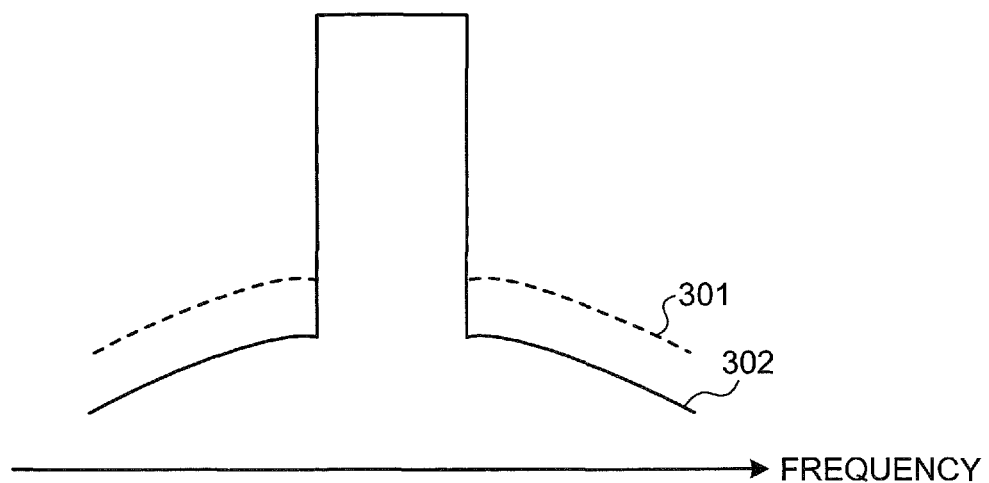
FIG. 3 depicts a first example of a signal that has been subjected to distortion compensation.

FIG. 3 depicts a first example of a signal that has been subjected to distortion compensation. A frequency spectrum 301 depicted in FIG. 3 represents the signal y(t) that is expected to result if distortion compensation is carried out based on the LUT 114*a*, using a single-dimensional address corresponding to the power p of the signal x(t). A frequency spectrum 302 represents the signal y(t) that is expected to result if distortion compensation is carried out based on the LUT 114*a*, using a two-dimensional address corresponding to the power p and the amplitude √p of the signal x(t).

As depicted by the frequency spectra 301 and 302, if the two-dimensional address corresponding to the power p and the amplitude √p of the signal x(t) is used, a side lobe of the signal y(t) becomes lower than the side lobe in the case of using the single-dimensional address corresponding to the power p of the signal x(t).

Figure 4:
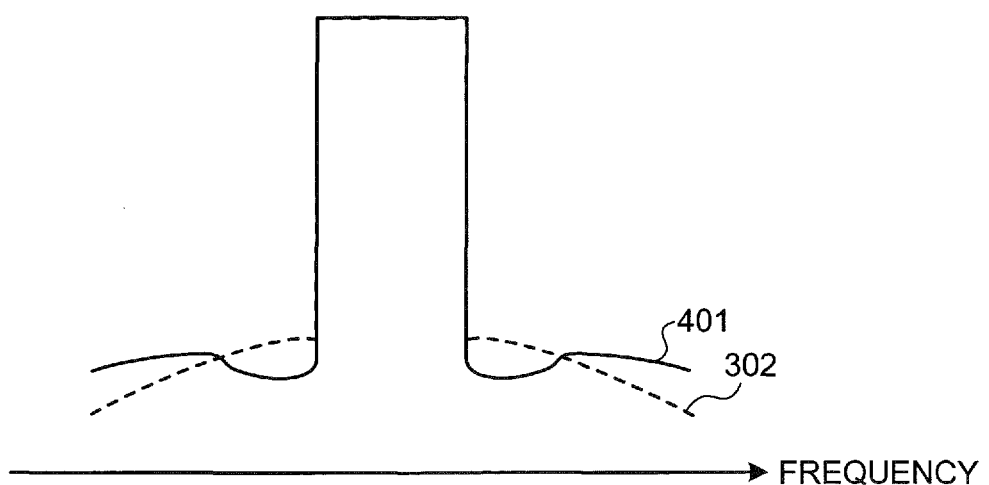
FIG. 4 depicts a second example of a signal that has been subjected to distortion compensation.

FIG. 4 depicts a second example of a signal that has been subjected to distortion compensation. In FIG. 4, elements identical to those depicted in FIG. 3 are denoted by the same reference numerals used in FIG. 3 and will be omitted in further description. A frequency spectrum 401 depicted in FIG. 4 represents the signal y(t) that results when distortion compensation is carried out based on the LUT 114*a*, using a two-dimensional address corresponding to the power p and the phase difference Δθ of the signal x(t).

As depicted by the frequency spectra 302 and 401, if the two-dimensional address corresponding to the power p and the phase difference Δθ of the signal x(t) is used, the side lobe of the signal y(t) is lowered further to become lower than the side lobe in the case of using the two-dimensional address corresponding to the power p and the amplitude √p of the signal x(t). In this manner, the distortion compensating apparatus 110 carries out distortion compensation based on the LUT 114*a*, using the two-dimensional address corresponding to the power p and the phase difference Δθ of the signal x(t), to lower the side lobe of the frequency spectrum, enabling reduction of electrical power leakage to adjacent channels.

Figure 5:
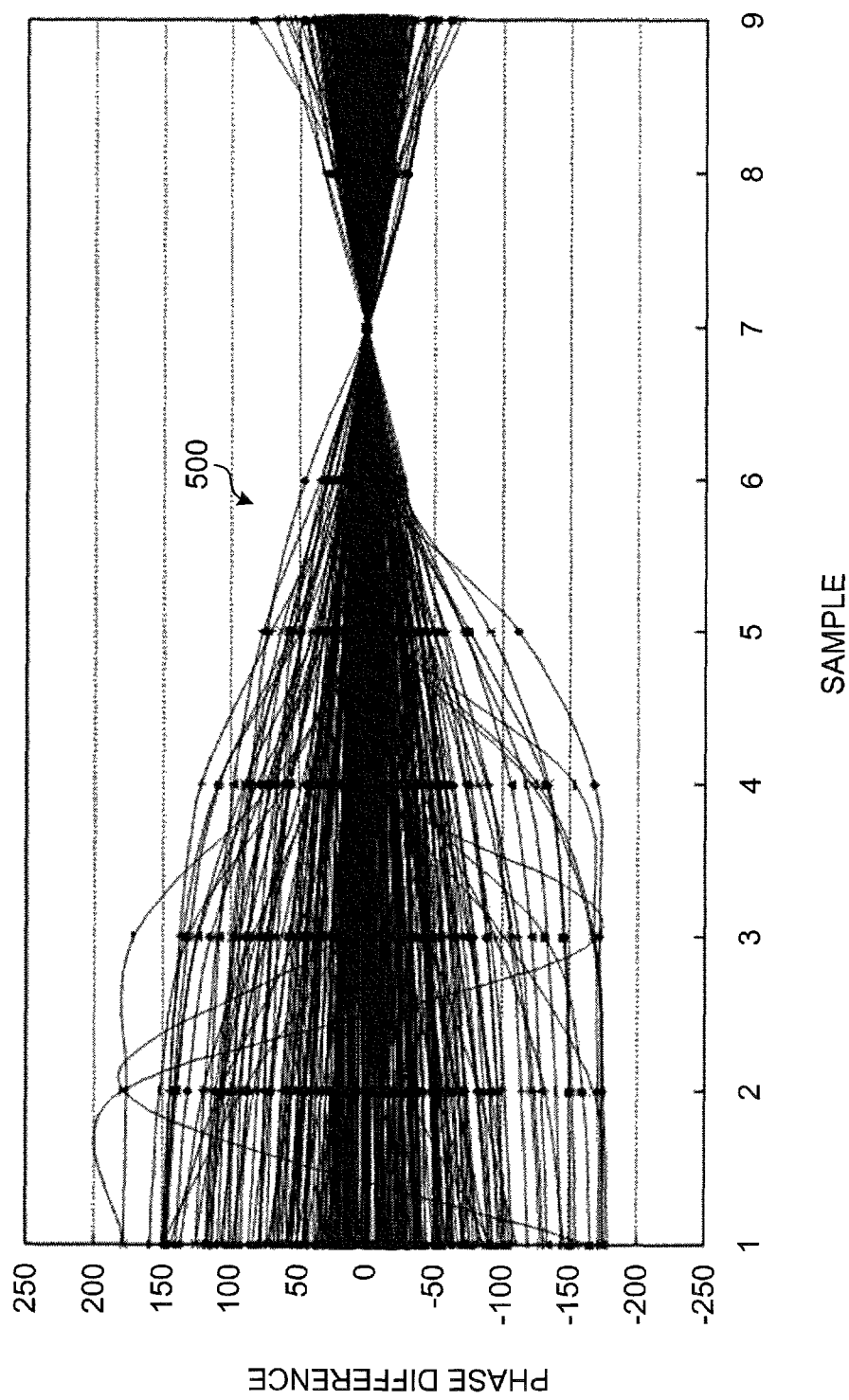
FIG. 5 depicts a signal transition made by a narrowband signal.
Figure 6:
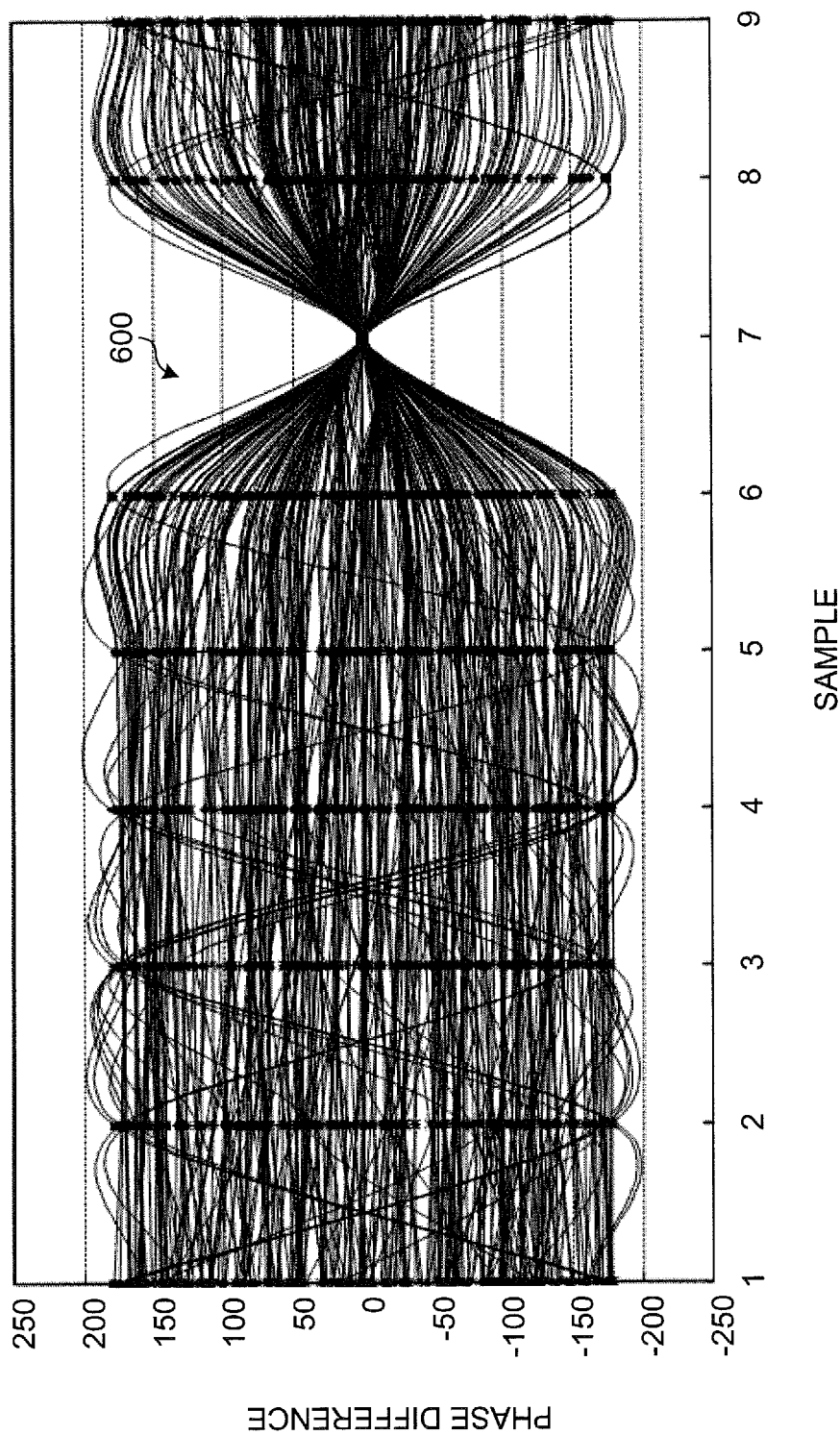
FIG. 6 depicts a signal transition made by a wideband signal.

FIG. 5 depicts a signal transition made by a narrowband signal. In FIG. 5, a signal transition 500 made by a WCDMA1 carrier signal is an example of a narrowband signal. FIG. 6 depicts a signal transition made by a wideband signal. In FIG. 6, a signal transition 600 made by a WCDMA4 carrier signal is an example of a wideband signal. In FIGS. 5 and 6, the horizontal axis represents signal sample numbers while the vertical axis represents phase differences Δθ from the phase of sample number 7.

As depicted in FIGS. 5 and 6, the wideband signal has a relatively larger phase difference Δθ per sample than that of the narrowband signal. Memory effect caused by the phase difference Δθ, therefore, is larger in the wideband signal than in the narrowband signal. The distortion compensating apparatus 110 uses the LUT, which is referenced using the instantaneous value P of input electrical power and the input phase variation value Δθ. Thus, accurate compensation of distortion that is caused by the memory effect near an output waveform from the amplifier 120, is enabled.

Figure 7:
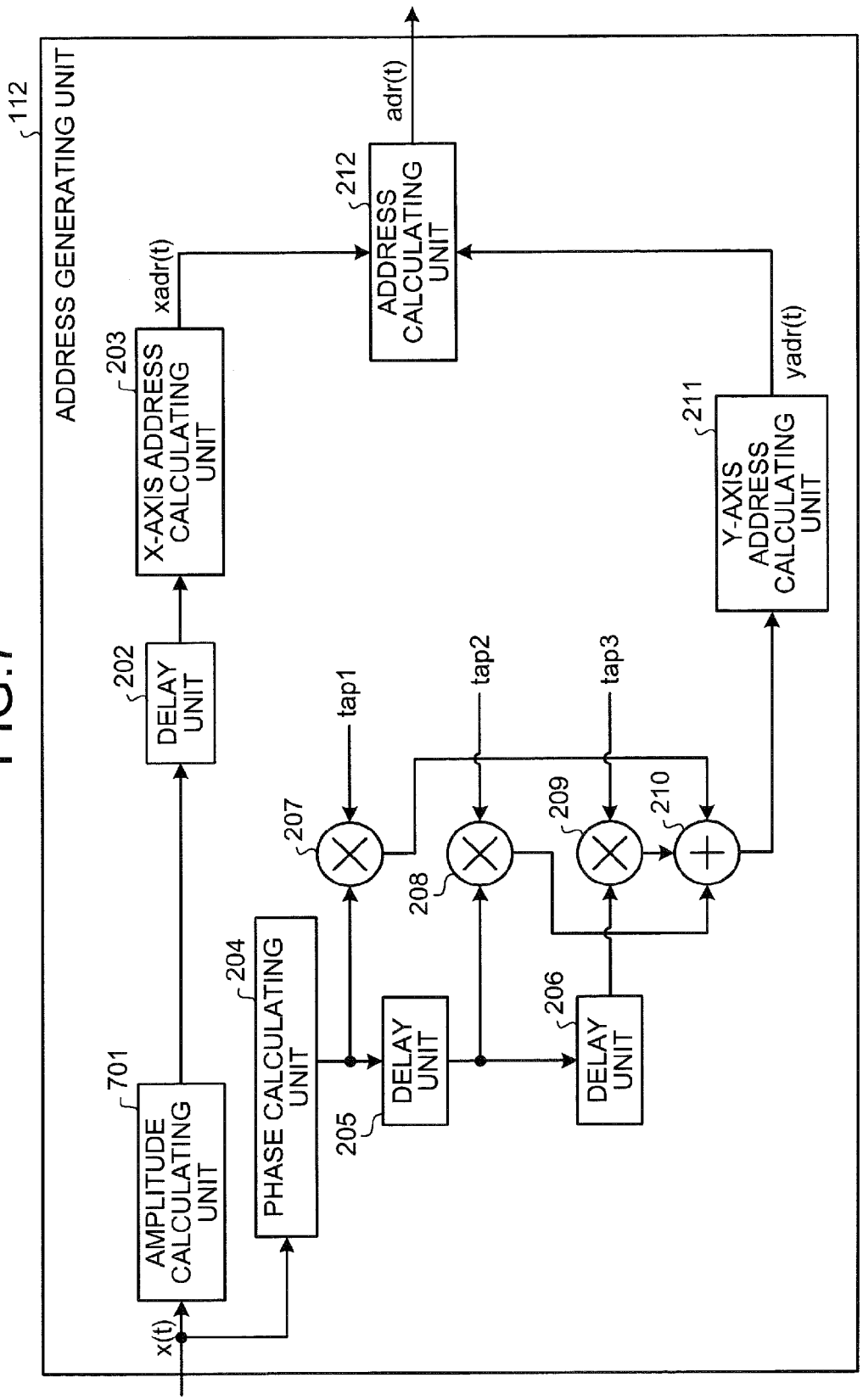
FIG. 7 is a block diagram of a first modification of the address generating unit depicted in FIG. 2.

FIG. 7 is a block diagram of a first modification of the address generating unit depicted in FIG. 2. In FIG. 7, constituent elements identical to those depicted in FIG. 2 are denoted by the same reference numerals used in FIG. 2 and will be omitted in further description. As depicted in FIG. 7, the address generating unit 112 may include an amplitude calculating unit 701 in place of the power calculating unit 201 depicted in FIG. 2. The signal x(t) input to the address generating unit 112 is input to the amplitude calculating unit 701 and to the phase calculating unit 204.

Based on the amplitude calculated from the electrical power of the input signal, the amplitude calculating unit 701, the delay unit 202, and the X-axis address calculating unit 203 generate the first address for acquiring a distortion compensation coefficient from the table managing unit 114.

Specifically, the amplitude calculating unit 701 calculates the amplitude √p (=√(x2(t))) of the signal x(t) from the power p (=x2(t)) of the input signal x(t). The amplitude calculating unit 701 outputs amplitude information indicative of the calculated amplitude √p to the delay unit 202. The delay unit 202 delays the amplitude information output from the amplitude calculating unit 701 by one sample and outputs the delayed amplitude information to the X-axis address calculating unit 203. The X-axis address calculating unit 203 normalizes the amplitude information output from the delay unit 202 to calculate the X-axis direction address.

Hence, the distortion compensating apparatus 110 is able to carry out distortion compensation based on the LUT 114*a*, using a two-dimensional address corresponding to the amplitude √p and the phase difference Δθ of the signal x(t), thereby lowering a side lobe of the frequency spectrum of an output waveform from the amplifier 120 to reduce electrical power leakage to adjacent channels.

Figure 8:
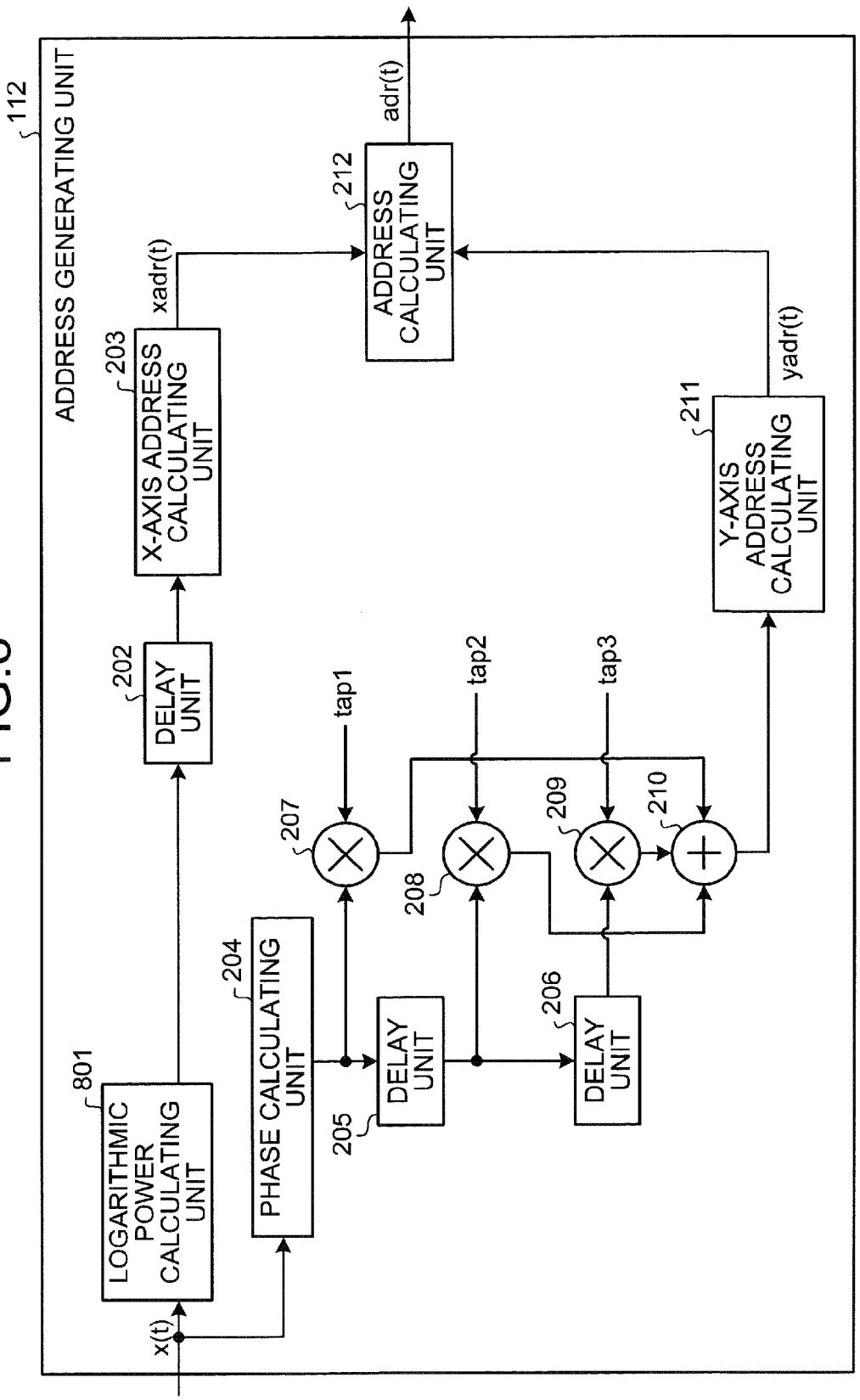
FIG. 8 is a block diagram of a second modification of the address generating unit depicted in FIG. 2.

FIG. 8 is a block diagram of a second modification of the address generating unit depicted in FIG. 2. In FIG. 8, constituent elements identical to those depicted in FIG. 2 are denoted by the same reference numerals used in FIG. 2 and will be omitted in further description. As depicted in FIG. 8, the address generating unit 112 may include a logarithmic electrical power calculating unit 801 in place of the power calculating unit 201 of FIG. 2. The signal x(t) input to the address generating unit 112 is input to the logarithmic electrical power calculating unit 801 and to the phase calculating unit 204.

Based on a logarithmic value representing the electrical power of the input signal, the logarithmic electrical power calculating unit 801, the delay unit 202, and the X-axis address calculating unit 203 generate the first address for acquiring a distortion compensation coefficient from the table managing unit 114.

Specifically, the logarithmic electrical power calculating unit 801 calculates a logarithmic value representing the power p (=x2(t)) of the input signal x(t) (logarithmic value logep). The logarithmic electrical power calculating unit 801 outputs to the delay unit 202, logarithmic electrical power information indicative of the calculated logarithmic value logep. The delay unit 202 delays the logarithmic electrical power information output from the logarithmic electrical power calculating unit 801 by one sample and outputs the delayed logarithmic electrical power information to the X-axis address calculating unit 203. The X-axis address calculating unit 203 normalizes the logarithmic electrical power information output from the delay unit 202 to calculate the X-axis direction address xadr(t).

Hence, the distortion compensating apparatus 110 is able to compensate distortion, based on the LUT 114*a* that uses a two-dimensional address corresponding to the logarithmic value logep of the power p and the phase difference Δθ of the signal x(t), whereby a side lobe of the frequency spectrum of an output waveform from the amplifier 120 can be lowered to reduce power leakage to adjacent channels.

In this manner, the distortion compensating apparatus 110 of the first embodiment uses the LUT 114*a*, in which a distortion compensation coefficient is associated with an address through the phase difference Δθ, to compensate the memory effect caused by the phase difference and thus, accurately compensate signal distortions. As a result, when electrical power efficiency is improved using the amplifier 120 inferior in linearity, nonlinear distortions of signals are compensated accurately to reduce electrical power leakage to adjacent channels.

The distortion compensating apparatus 110 according to a second embodiment has a configuration identical to the configuration depicted in FIG. 1. The address generating unit 112 of the distortion compensating apparatus 110 of the second embodiment, however, generates a Z-axis direction address (third address) for selecting a distortion compensation coefficient from the table managing unit 114, based on the amplitude of an input signal.

The address generating unit 112 generates a synthesized address by synthesizing the X-axis direction address, the Y-axis direction address, and the Z-axis direction address. This synthesized address is, for example, an address that uniquely corresponds to a combination of the X-axis direction address, the Y-axis direction address, and the Z-axis direction address.

The multiplying unit 111 compensates distortion of the input signal using a distortion compensation coefficient that is acquired from the table managing unit 114, based on the X-axis direction address, the Y-axis direction address, and the Z-axis direction address. The table managing unit 114 stores a distortion compensation coefficient calculated and associated with the X-axis direction address, the Y-axis direction address, and the Z-axis direction address.

The table managing unit 114 stores the LUT 114*a* that associates distortion compensation coefficients with three-dimensional addresses. A three-dimensional address is an address that is a combination of the X-axis direction address, the Y-axis direction address, and the Z-axis direction address. The table managing unit 114 acquires the X-axis direction address, the Y-axis direction address, and the Z-axis direction address, from the read-in address AR output from the address generating unit 112. The table managing unit 114 then reads out from the LUT 114*a*, a distortion compensation coefficient corresponding to a combination of the acquired addresses.

The table managing unit 114 acquires the X-axis direction address, the Y-axis direction address, and the Z-axis direction address from the write-in address AW output from the delay unit 113, and writes to an area of the LUT 114*a* that corresponds to the combination of the acquired addresses, an updated distortion compensation coefficient value output from the adding unit 119.

Figure 9:
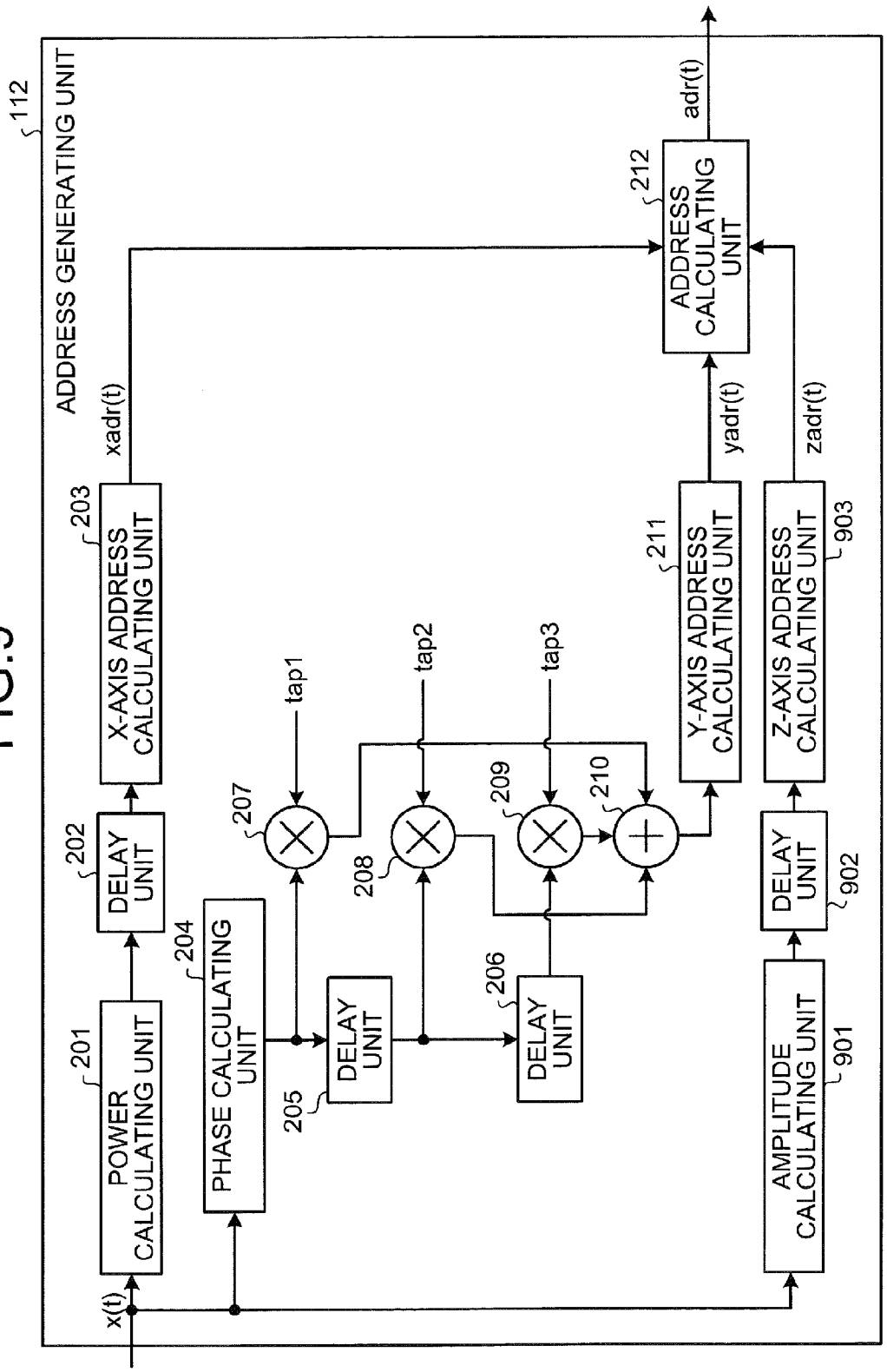
FIG. 9 is a block diagram of an example of the address generating unit according to a second embodiment.

FIG. 9 is a block diagram of an example of the address generating unit according to the second embodiment. In FIG. 9, constituent elements identical to those depicted in FIG. 2 are denoted by the same reference numerals used in FIG. 2 and will be omitted in further description. As depicted in FIG. 9, the address generating unit 112 of the second embodiment includes an amplitude calculating unit 901, a delay unit 902, and a Z-axis address calculating unit 903, in addition to the constituent elements depicted in FIG. 1. The signal x(t) input to the address generating unit 112 is input to the power calculating unit 201, to the phase calculating unit 204, and to the amplitude calculating unit 901.

The amplitude calculating unit 901, the delay unit 902, and the Z-axis address calculating unit 903 generate the third address for acquiring a distortion compensation coefficient from the LUT 114*a*, based on the amplitude of the input signal. Specifically, the amplitude calculating unit 901 calculates the amplitude $\sqrt{p}$ of the input signal x(t) and outputs to the delay unit 902, amplitude information indicative of the calculated amplitude $\sqrt{p}$. The delay unit 902 delays the amplitude information output from the amplitude calculating unit 901 by one sample and outputs the delayed amplitude information to the Z-axis address calculating unit 903.

The Z-axis address calculating unit 903 normalizes the amplitude information output from the delay unit 902 to calculate the Z-axis direction address and outputs the calculated Z-axis direction address zadr(t) to the address calculating unit 212. The address calculating unit 212 synthesizes the X-axis direction address xadr(t) from the X-axis address calculating unit 203, the Y-axis direction address yadr(t) from the Y-axis address calculating unit 211, and the Z-axis direction address zadr(t) from the Z-axis address calculating unit 903 and outputs a resulting synthesized address adr(t).

Hence, the distortion compensating apparatus 110 is able to compensate distortion, based on the LUT 114*a*, using a three-dimensional address corresponding to the power p, the phase difference $\Delta\theta$, and the amplitude $\sqrt{p}$ of the signal x(t), thereby enabling the lowering of a side lobe of the frequency spectrum of an output waveform from the amplifier 120 and a reduction in power leakage to adjacent channels.

The delay rate at each of the delay units 202, 205, 206, and 902 is not limited to a delay time equivalent to one sample of the signal x(t). For example, the delay rate at each of the delay units 202, 205, 206, and 902 may be determined to be a delay time equivalent to ½ or 2 times one sample of the signal x(t).

For example, the delay rate at each of the delay units 202, 205, and 902 is set so that the power information output from the power calculating unit 201, the phase information output from the multiplying unit 208, and the amplitude information output from the amplitude calculating unit 901 coincide in timing. As a result, the phase information output from the multiplying unit 208 is used as a reference for the Y-axis direction address to match the output timing of the X-axis direction address, the output timing of the Y-axis direction address, and the output timing of the Z-axis direction address with one another.

Figure 10:
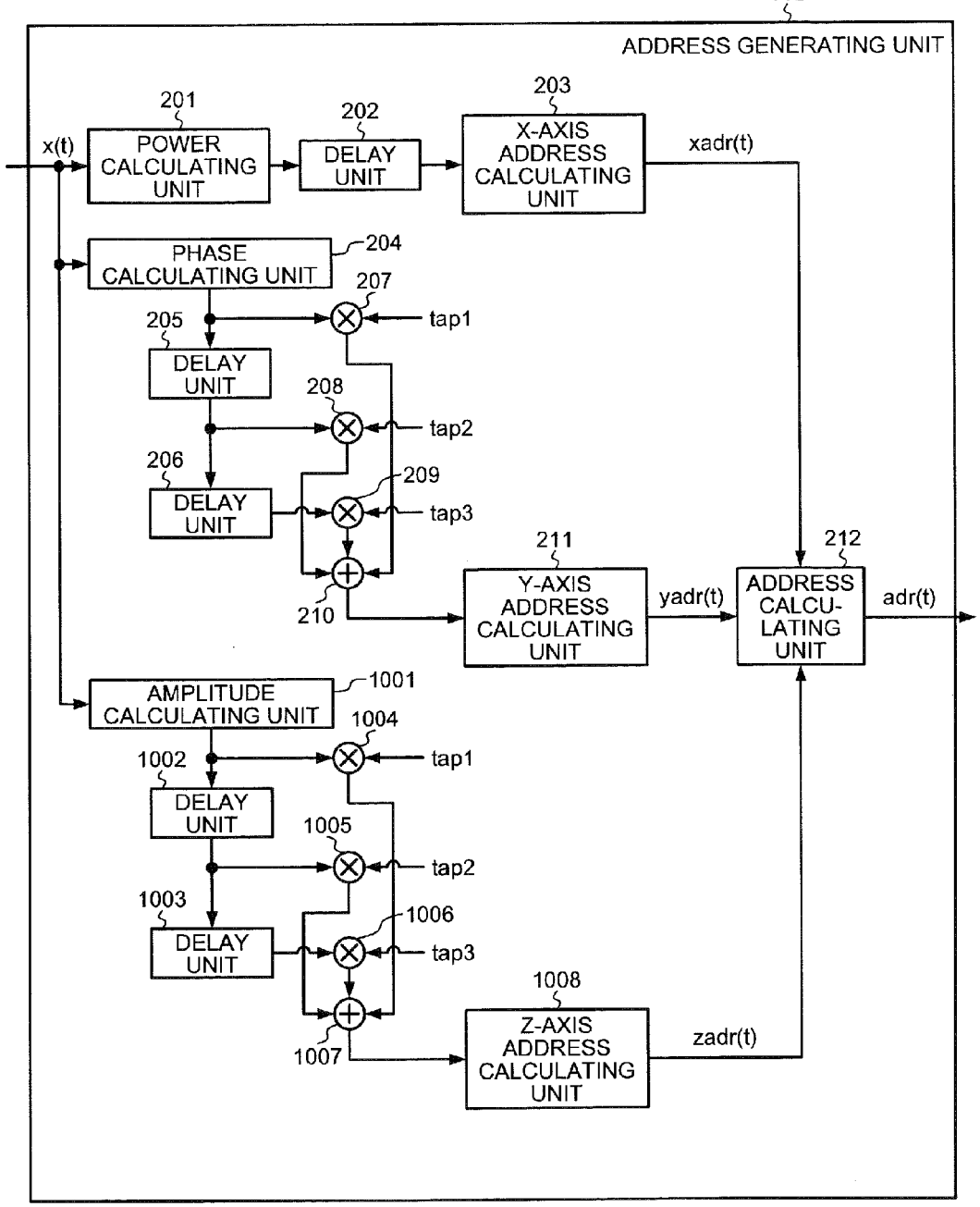
FIG. 10 is a block diagram of a modification of the address generating unit depicted in FIG. 9.

FIG. 10 is a block diagram of a modification of the address generating unit depicted in FIG. 9. In FIG. 10, constituent elements identical to those depicted in FIG. 2 are denoted by the same reference numerals used in FIG. 2 and will be omitted in further description. As depicted in FIG. 10, the address generating unit 112 of the second embodiment may include an amplitude calculating unit 1001, delay units 1002 and 1003, multiplying units 1004 to 1006, an adding unit 1007, and a Z-axis address calculating unit 1008, in addition to the constituent elements depicted in FIG. 1. The signal x(t) input to the address generating unit 112 is input to the power calculating unit 201, to the phase calculating unit 204, and to the amplitude calculating unit 1001.

Based on the amplitude of the input signal, the amplitude calculating unit 1001, the delay units 1002 and 1003, the multiplying units 1004 to 1006, the adding unit 1007, and the Z-axis address calculating unit 1008 generate the third address for acquiring a distortion compensation coefficient from the ULT 114*a*. Specifically, the amplitude calculating unit 1001 calculates the amplitude $\sqrt{p}$ of the input signal x(t). The amplitude calculating unit 1001 outputs to the delay unit 1002 and to the multiplying unit 1004, amplitude information indicative of the calculated amplitude $\sqrt{p}$.

The delay unit 1002 delays the amplitude information output from the amplitude calculating unit 1001 by one sample and outputs the delayed amplitude information to the delay unit 1003 and to the multiplying unit 1005. The delay unit 1003 delays the amplitude information output from the delay unit 1002 by one sample and outputs the delayed amplitude information to the multiplying unit 1006.

The multiplying unit 1004 multiplies the amplitude information output from the amplitude calculating unit 1001 by a tap coefficient tap11 and outputs the resulting amplitude information to the adding unit 1007. The multiplying unit 1005 multiplies the amplitude information output from the delay unit 1002 by a tap coefficient tap12 and outputs the resulting amplitude information to the adding unit 1007. The multiplying unit 1006 multiplies the amplitude information output from the delay unit 1003 by a tap coefficient tap13 and outputs the resulting amplitude information to the adding unit 1007.

The adding unit 1007 adds up the signals output from the multiplying units 1004 to 1006. The sum obtained by the adding unit 1007 represents amplitude differences $\Delta\sqrt{p}$ between three different points of time (e.g., past, present, and future) of the signal x(t). While a case of calculating the amplitude differences $\Delta\sqrt{p}$ between three points of time is described, amplitude differences $\Delta\sqrt{p}$ between other points of time, such as two or four points of time, may also be calculated. The adding unit 1007 outputs the sum as amplitude difference information to the Z-axis address calculating unit 1008.

The Z-axis address calculating unit 1008 normalizes the amplitude difference information output from the adding unit 1007 to calculate the Z-axis direction address. The Z-axis address calculating unit 1008 outputs the calculated Z-axis direction address zadr(t) to the address calculating unit 212.

The address calculating unit 212 synthesizes the X-axis direction address xadr(t) from the X-axis address calculating unit 203, the Y-axis direction address yadr(t) from the Y-axis address calculating unit 211, and the Z-axis direction address zadr(t) from the Z-axis address calculating unit 1008 and outputs a resulting synthesized address adr(t).

Hence, the distortion compensating apparatus 110 is able to compensate distortion, based on the LUT 114a, using a three-dimensional address corresponding to the power p, the phase difference $\Delta\theta$, and the amplitude difference $\Delta\sqrt{p}$ of the signal x(t), thereby enabling the lowering of a side lobe of the frequency spectrum of an output waveform from the amplifier 120 and a reduction in electrical power leakage to adjacent channels.

The amplitude calculating unit 1001 depicted in FIG. 10 may be replaced with a power calculating unit (electrical power calculating unit) (not depicted) that calculates the power p of the signal x(t), and outputs the calculated power p to the delay unit 1002 and to the multiplying unit 1004. In such a case, the sum obtained by the adding unit 1007 represents power differences (electrical power differences) $\Delta p$ between three different points of time of the signal x(t). The adding unit 1007 outputs the sum as power difference information to the Z-axis address calculating unit 1008.

The Z-axis address calculating unit 1008 normalizes the power difference information output from the adding unit 1007 to calculate the Z-axis direction address. Hence, the distortion compensating apparatus 110 is able compensate distortion, based on the LUT 114a, using a three-dimensional address corresponding to the power p, the phase difference $\Delta\theta$, and the power difference $\Delta p$ of the signal x(t). Thus, with this configuration, the distortion compensating apparatus 110 is further capable of lowering a side lobe of the frequency spectrum of an output waveform from the amplifier 120, whereby power leakage to adjacent channels is reduced.

The amplitude calculating unit 1001 of FIG. 10 may be replaced with the logarithmic electrical power calculating unit (not depicted) that calculates the logarithmic value logep of the power p of the signal x(t), and outputs the calculated logarithmic electrical power to the delay unit 1002 and to the multiplying unit 1004. In such a case, the sum obtained by the adding unit 1007 represents logarithmic electrical power differences $\Delta logep$ between three different points of time. The adding unit 1007 outputs the sum as logarithmic electrical power difference information to the Z-axis address calculating unit 1008.

The Z-axis address calculating unit 1008 normalizes the logarithmic electrical power difference information output from the adding unit 1007 to calculate the Z-axis direction address zadr(t). Hence, the distortion compensating apparatus 110 is able to compensate distortion, based on the LUT 114a, using a three-dimensional address corresponding to the power p, the phase difference $\Delta\theta$, and the logarithmic electrical power difference $\Delta logep$ of the signal x(t). This configuration further enables the lowering of a side lobe of the frequency spectrum of an output waveform from the amplifier 120, whereby power leakage to adjacent channels is reduced.

The delay rate at each of the delay units 202, 205, 206, 1002, and 1003 is not limited to a delay time equivalent to one sample of the signal x(t). For example, the delay rate at each of the delay units 202, 205, 206, 1002, and 1003 may be determined to be a delay time equivalent to ½ or 2 times one sample of the signal x(t).

For example, the delay rate at each of the delay units 202, 205, and 1002 is set so that the power information output from the power calculating unit 201, the phase information output from the multiplying unit 208, and the amplitude information output from the multiplying unit 1005 coincide in timing. As a result, the phase information output from the multiplying unit 208 is used as a reference for the Y-axis direction address, the amplification information output from the multiplying unit 1005 is used as a reference for the X-axis direction address, enabling the output timing of the Y-axis direction address, the X-axis direction address, and the Z-axis direction address to be matched with one another.

Figure 11:
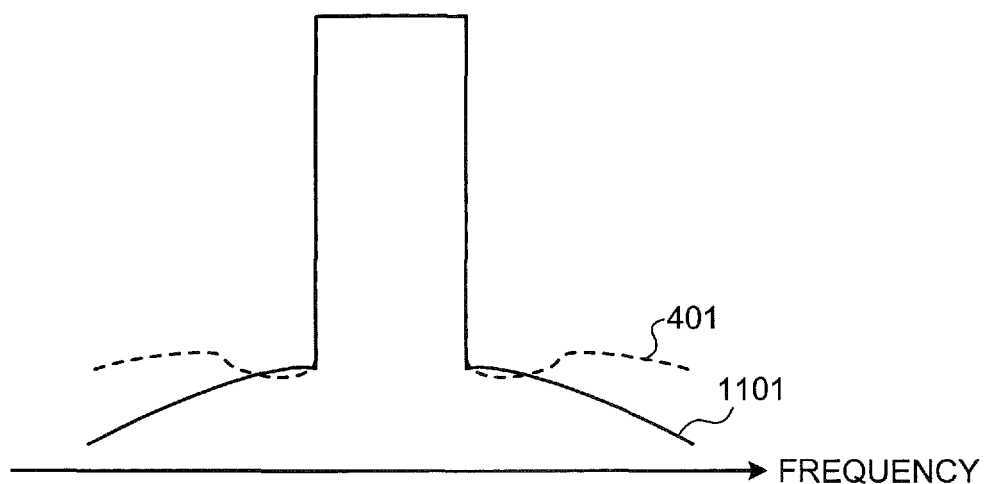
FIG. 11 depicts a third example of a signal that has been subjected to distortion compensation.

FIG. 11 depicts a third example of a signal that has been subjected to distortion compensation. In FIG. 11, constituent elements identical to those depicted in FIG. 4 are denoted by the same reference numerals used in FIG. 4 and will be omitted in further description. A frequency spectrum 1101 in FIG. 11 indicates the signal y(t) that results when distortion is compensated based on the LUT 114a, using a three-dimensional address corresponding to the power p, the amplitude difference $\Delta\sqrt{p}$, and the phase difference $\Delta\theta$ of the signal x(t).

As depicted by the frequency spectra 401 and 1101, if the three-dimensional address corresponding to the power p, the amplitude difference $\Delta\sqrt{p}$, and the phase difference $\Delta\theta$ of the signal x(t) is used, the side lobe of the signal y(t) is lowered further to become lower than the side lobe in the case of using a two-dimensional address. This allows a further reduction in electrical power leakage to adjacent channels.

Figure 12:
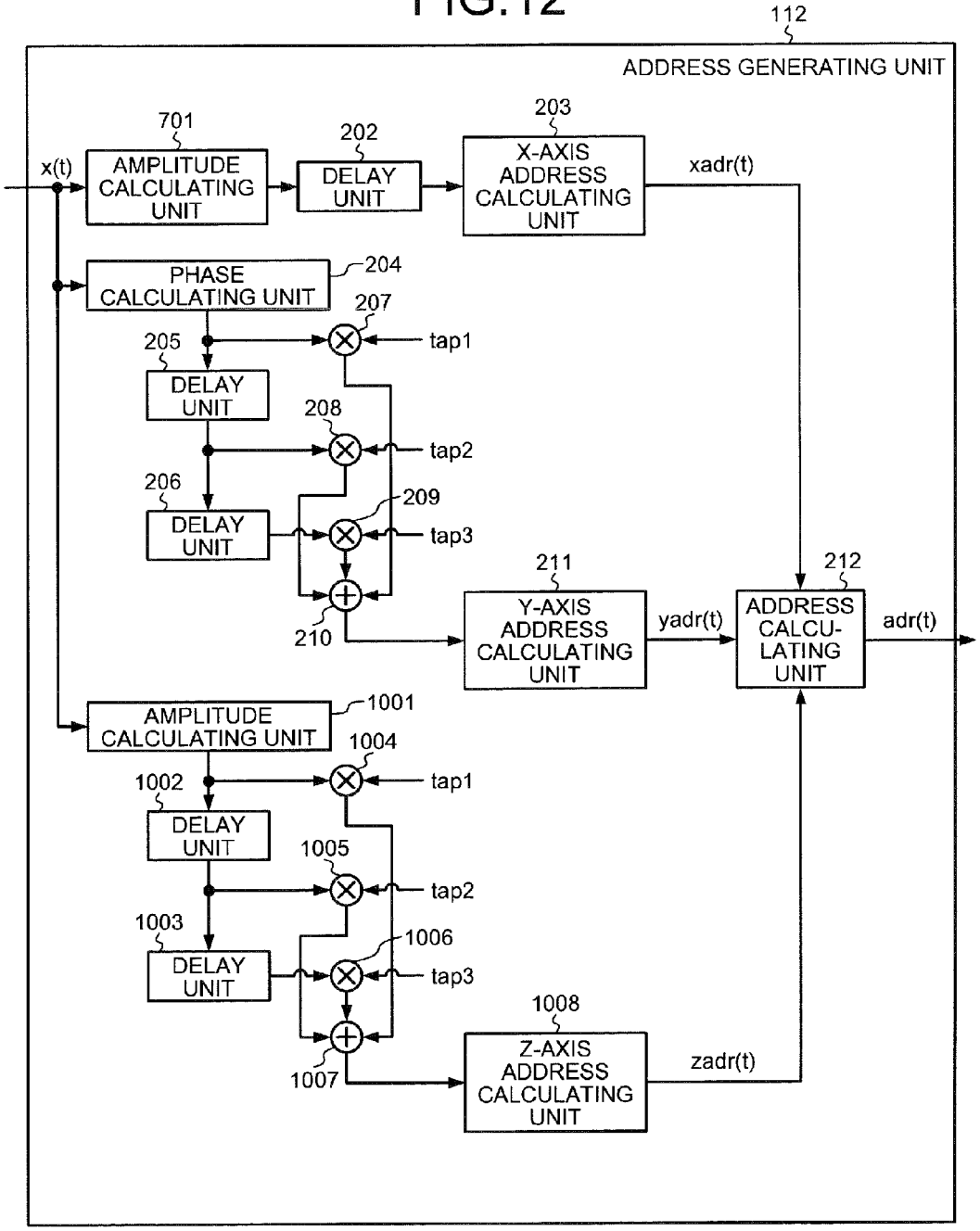
FIG. 12 is a block diagram of a first modification of the address generating unit depicted in FIG. 10.

FIG. 12 is a block diagram of a first modification of the address generating unit depicted in FIG. 10. In FIG. 12, constituent elements identical to those depicted in FIG. 7 or FIG. 10 are denoted by the same reference numerals used in FIG. 7 or FIG. 10, and will be omitted in further description. As depicted in FIG. 12, the address generating unit 112 may include the amplitude calculating unit 701 (see FIG. 7) in place of the power calculating unit 201 of FIG. 10.

Hence, the distortion compensating apparatus 110 is able to compensate distortion, based on the LUT 114a, using a three-dimensional address corresponding to the amplitude $\sqrt{p}$, the phase difference $\Delta\theta$, and the amplitude difference $\Delta\sqrt{p}$ of the signal x(t), thereby enabling a lowering of a side lobe of the frequency spectrum of an output waveform from the amplifier 120 and reduction in electrical power leakage to adjacent channels.

The amplitude calculating unit 1001 depicted in FIG. 12 may be replaced with the power calculating unit (not depicted) that calculates the power p of the signal x(t) so that output from the power calculating unit goes to the delay unit 1002 and to the multiplying unit 1004. In such a case, the sum obtained by the adding unit 1007 represents power differences (electrical power differences) Δp between three different points of time of the signal x(t). The adding unit 1007 outputs the sum as power difference information to the Z-axis address calculating unit 1008.

The Z-axis address calculating unit 1008 normalizes the power difference information output from the adding unit 1007 to calculate the Z-axis direction address zadr(t). Hence, the distortion compensating apparatus 110 is able to compensate distortion, based on the LUT 114a, using a three-dimensional address corresponding to the amplitude √p, the phase difference Δθ, and the power difference Δp of the signal x(t). With this configuration, therefore, the distortion compensating apparatus 110 is further capable of lowering a side lobe of the frequency spectrum of an output waveform from the amplifier 120 to reduce electrical power leakage to adjacent channels.

The amplitude calculating unit 1001 depicted FIG. 12 may be replaced with the logarithmic electrical power calculating unit (not depicted) that calculates the logarithmic value logep of the power p of the signal x(t), where output from the logarithmic electrical power calculating unit goes to the delay unit 1002 and to the multiplying unit 1004. In such a case, the sum obtained by the adding unit 1007 represents logarithmic electrical power differences Δlogep between three different points of time. The adding unit 1007 outputs the sum as logarithmic electrical power difference information to the Z-axis address calculating unit 1008.

The Z-axis address calculating unit 1008 normalizes the logarithmic electrical power difference information from the adding unit 1007 to calculate the Z-axis direction address zadr(t). Hence, the distortion compensating apparatus 110 is able to compensate distortion, based on the LUT 114a, using a three-dimensional address corresponding to the amplitude √p, the phase difference Δθ, and the logarithmic electrical power difference Δlogep of the signal x(t). Thus, with this configuration, the distortion compensating apparatus 110 is further capable of lowering a side lobe of the frequency spectrum of an output waveform from the amplifier 120 to reduce electrical power leakage to adjacent channels.

Figure 13:
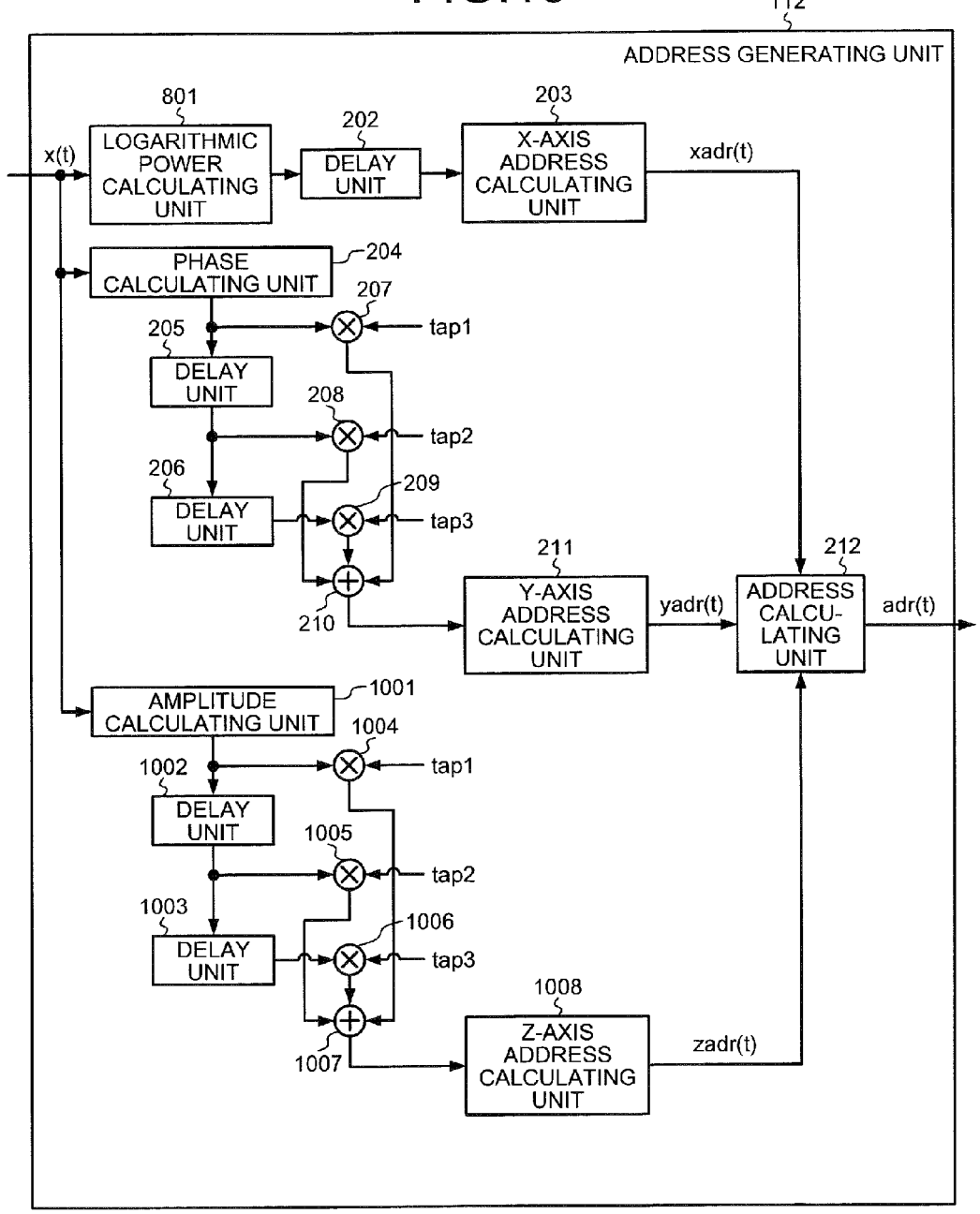
FIG. 13 is a block diagram of a second modification of the address generating unit depicted in FIG. 10.

FIG. 13 is a block diagram of a second modification of the address generating unit depicted in FIG. 10. In FIG. 13, constituent elements identical to those depicted in FIG. 8 or FIG. 10 are denoted by the same reference numerals used in FIG. 8 or FIG. 10, and will be omitted in further description. As depicted in FIG. 13, the address generating unit 112 may include the logarithmic electrical power calculating unit 801 (see FIG. 8) in place of the power calculating unit 201 depicted in FIG. 10.

Hence, the distortion compensating apparatus 110 is able to compensate distortion, based on the LUT 114a, using a three-dimensional address corresponding to the logarithmic value logep of the power p, the phase difference Δθ, and the amplitude difference Δ√p of the signal x(t), thereby lowering a side lobe of the frequency spectrum of an output waveform from the amplifier 120 to reduce electrical power leakage to adjacent channels.

The amplitude calculating unit 1001 depicted in FIG. 13 may be replaced with the power calculating unit (not depicted) that calculates the power p of the signal x(t), where output from the power calculating unit goes to the delay unit 1002 and to the multiplying unit 1004. In such a case, the sum obtained by the adding unit 1007 represents power differences (electrical power differences) Δp between three different points of time of the signal x(t). The adding unit 1007 outputs the sum as power difference information to the Z-axis address calculating unit 1008.

The Z-axis address calculating unit 1008 normalizes the power difference information from the adding unit 1007 to calculate the Z-axis direction address zadr(t). Hence the distortion compensating apparatus 110 is able to compensate distortion, based on the LUT 114a, using a three-dimensional address corresponding to the logarithmic value logep of the power p, the phase difference Δθ, and the power difference Δp of the signal x(t). Thus, with this configuration, the distortion compensating apparatus 110 is further capable of lowering a side lobe of the frequency spectrum of an output waveform from the amplifier 120 to reduce electrical power leakage to adjacent channels.

The amplitude calculating unit 1001 depicted in FIG. 13 may be replaced with the logarithmic electrical power calculating unit (not depicted) that calculates the logarithmic value logep of the power p of the signal x(t) so that output from the logarithmic electrical power calculating unit goes to the delay unit 1002 and to the multiplying unit 1004. In such a case, the sum obtained by the adding unit 1007 represents logarithmic electrical power differences Δlogep between three different points of time. The adding unit 1007 outputs the addition result as logarithmic electrical power difference information to the Z-axis address calculating unit 1008.

The Z-axis address calculating unit 1008 normalizes the logarithmic electrical power difference information output from the adding unit 1007 to calculate the Z-axis direction address zadr(t). Hence, the distortion compensating apparatus 110 is able to compensate distortion, based on the LUT 114a, using a three-dimensional address corresponding to the logarithmic value logep, the phase difference Δθ, and the logarithm electrical power difference Δlogep of the signal x(t). Thus, with this configuration, the distortion compensating apparatus 110 is further capable of lowering a side lobe of the frequency spectrum of an output waveform from the amplifier 120 to reduce electrical power leakage to adjacent channels.

In this manner, the distortion compensating apparatus 110 of the second embodiment uses the LUT 114a, in which a distortion compensation coefficient is associated with an address through the phase difference Δθ, to compensate the memory effect caused by the phase difference, thus accurately compensates distortions of signals. The distortion compensating apparatus 110 uses the LUT 114a, in which a distortion compensation coefficient is associated with an address through a three-dimensional value including the phase difference Δθ, to compensate nonlinear distortions of signals more accurately.

Figure 14:
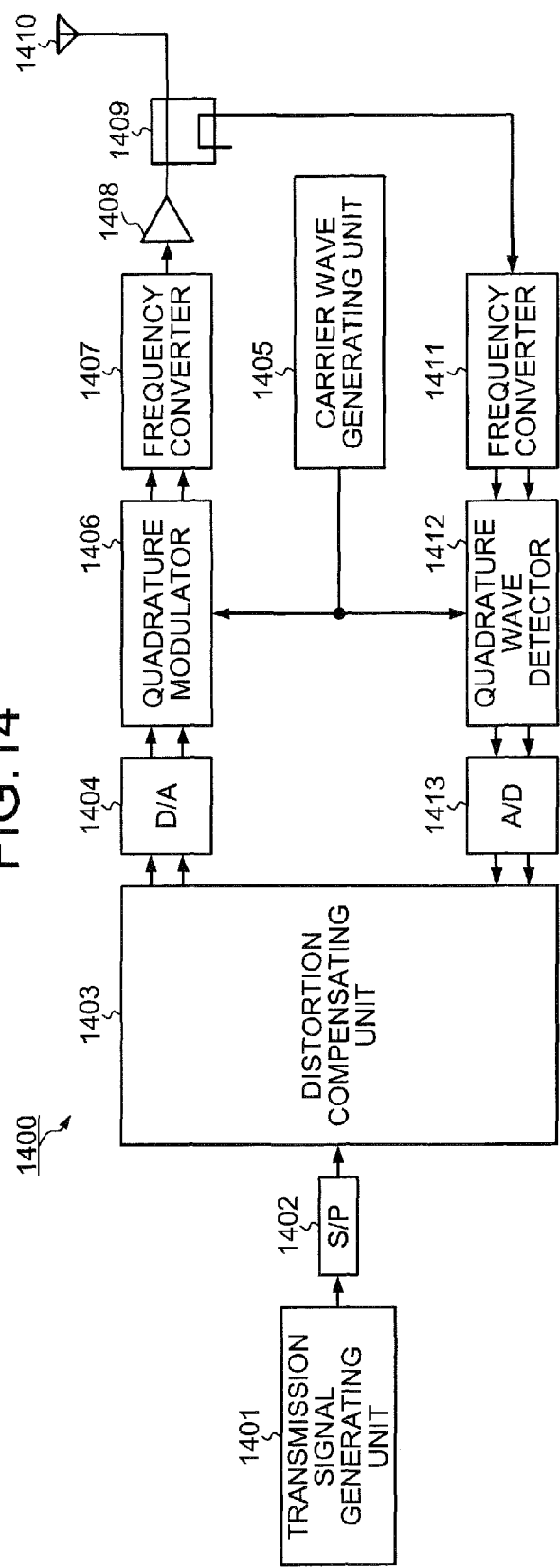
FIG. 14 is a block diagram of an example of a transmitting apparatus according to a third embodiment.

FIG. 14 is a block diagram of an example of a transmitting apparatus according to a third embodiment. A transmitting apparatus 1400 of the third embodiment carries out digital nonlinear distortion compensation based on the adaptive LMS algorithm. As depicted in FIG. 14, the transmitting apparatus 1400 includes a transmission signal generating unit 1401, a parallel converter 1402, a distortion compensating unit 1403, an analog converter 1404, a carrier wave generating unit 1405, a quadrature modulator 1406, a frequency converter 1407, an amplifier 1408, a directional coupler 1409, an antenna 1410, a frequency converter 1411, an quadrature wave detector 1412, and a digital converter 1413.

The transmission signal generating unit 1401 generates a digital transmission signal (serial signal) and outputs the digital transmission signal to the parallel converter 1402. The parallel converter 1402 alternately divides the transmission signal output from the transmission signal generating unit

1401 bit by bit to convert the transmission signal into two types of parallel signals consisting of an I signal (in-phase component) and a Q signal (quadrature component). The parallel converter 1402 outputs the converted I signal and Q signal to the distortion compensating unit 1403.

The distortion compensating unit 1403 carries out digital nonlinear distortion compensation on the I signal and Q signal output from the parallel converter 1402. Specifically, the distortion compensating unit 1403 compares the pre-compensation transmission signals output from the parallel converter 1402 with feedback signals that have been demodulated by the quadrature wave detector 1412 and output from the digital converter 1413. The distortion compensating unit 1403 then calculates a distortion compensation coefficient so that differences between the compared signals become zero. The distortion compensating unit 1403 outputs to the analog converter 1404, the I signal and Q signal subjected to digital nonlinear distortion compensation.

The analog converter 1404 converts the I signal and Q signal output from the distortion compensating unit 1403 into analog base band signals and outputs the base band signals to the quadrature modulator 1406. The carrier wave generating unit 1405 generates reference carrier waves, and outputs the generated carrier waves to the quadrature modulator 1406 and to the quadrature wave detector 1412.

The quadrature modulator 1406 carries out quadrature modulation of the reference carrier waves output from the carrier wave generating unit 1405, based on the I signal and Q signal output from the analog converter 1404. Specifically, the quadrature modulator 1406 multiplies each of the reference carrier waves, which differ in phase by 90 degrees, by the I signal and Q signal and sums the multiplication results in carrying out quadrature modulation. The quadrature modulator 1406 outputs the quadrature modulated signals resulting from the quadrature modulation, to the frequency converter 1407.

The frequency converter 1407 mixes the quadrature modulated signals output from the quadrature modulator 1406 with a local oscillation signal to frequency convert the quadrature modulated signals. The frequency converter 1407 outputs radio frequency signals resulting from the frequency conversion to the amplifier 1408, which is a transmission electrical power amplifier that amplifies the electrical power of the radio frequency signals output from the frequency converter 1407. The amplifier 1408 outputs the amplified radio frequency signals to the directional coupler 1409.

The directional coupler 1409 branches the radio frequency signals output from the amplifier 1408 and outputs one branch of the radio frequency signal to the antenna 1410 and the other branch of radio frequency signal to the frequency converter 1411. The antenna 1410 is a transmitting unit that emits the radio frequency signals output from the directional coupler 1409 into air. Hence, the radio frequency signals are sent out by radio transmission.

The frequency converter 1411 frequency converts the radio frequency signals output from the directional coupler 1409, based on a local oscillation signal. The frequency converter 1411 outputs to the quadrature wave detector 1412, the quadrature modulated signals resulting from the frequency conversion.

The quadrature wave detector 1412 carries out quadrature wave detection on the quadrature modulated signals output from the frequency converter 1411 by multiplying the quadrature modulated signals by each of the reference carrier waves that differ in phase by 90 degrees. The quadrature wave detector 1412 outputs the I signal and Q signal resulting from the quadrature wave detection to the digital converter 1413, which converts the I signal and Q signal output from the quadrature wave detector 1412 into digital signals and outputs the digital signals to the distortion compensating unit 1403.

The distortion compensating apparatus 110 depicted in FIG. 1 corresponds to, for example, the distortion compensating unit 1403. The amplifier 120 of FIG. 1 corresponds to, for example, the amplifier 1408. The feedback line 130 depicted in FIG. 1 corresponds to, for example, the directional coupler 1409, the frequency converter 1411, the quadrature wave detector 1412, and the digital converter 1413.

Figure 15:
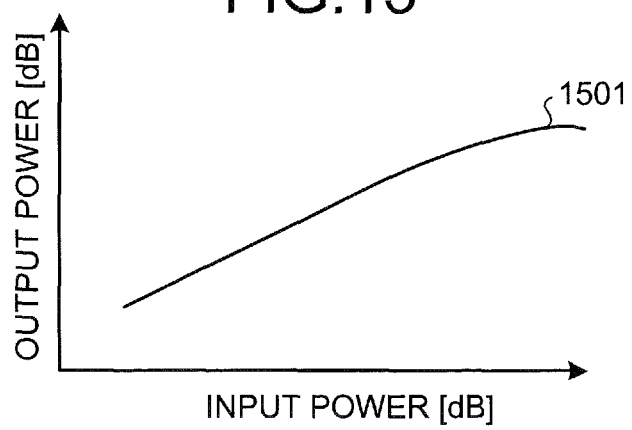
FIG. 15 is a graph of input/output characteristics of an amplifier.

FIG. 15 is a graph of the input/output characteristics of the amplifier. In FIG. 15, the horizontal axis represents input electrical power [dB] to the amplifier 1408, while the vertical axis represents output electrical power [dB] from the amplifier 1408. Input/output characteristics 1501 represent the input/output characteristics of the amplifier 1408. In mobile communication, such as W-CDMA, the transmission power of the transmitting apparatus is large, ranging from ten [mW] to scores [W], whereby the input/output characteristics 1501 of the amplifier 1408 becomes nonlinear.

Figure 16:
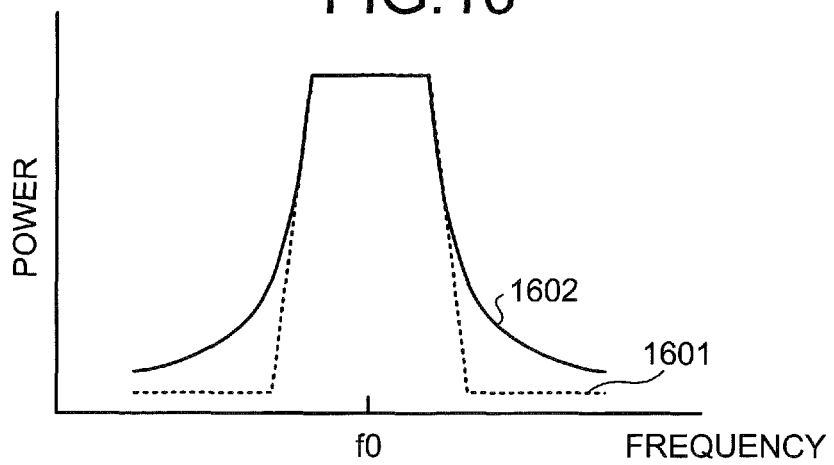
FIG. 16 depicts signal distortion caused by nonlinearity of the input/output characteristics of the amplifier.

FIG. 16 depicts signal distortion caused by the nonlinearity of the input/output characteristics of the amplifier. In FIG. 16, the horizontal axis represents the frequency of the signal amplified by the amplifier 1408, while the vertical axis represents the electrical power of the signal amplified by the amplifier 1408. A transmission frequency f0 represents the transmission frequency of a signal amplified by the amplifier 1408.

A frequency spectrum 1601 indicates the signal that is input to the amplifier 1408 without being subjected to distortion compensation by the distortion compensating unit 1403. A frequency spectrum 1602 indicates the signal that is output from the amplifier 1408 without being subjected to distortion compensation by the distortion compensating unit 1403. The frequency spectra 1601 and 1602 demonstrate that the nonlinearity of the input/output characteristics 1501 of the amplifier 1408 (see FIG. 15) results in the deformation of the frequency spectrum around the transmission frequency f0 of the signal, causing a side lobe to rise during amplification by the amplifier 1408.

The transmitting apparatus 1400 depicted in FIG. 14 accurately compensates nonlinear distortion of the signal through the adaptive LMS algorithm by the distortion compensating unit 1403 to suppress a rise in the side lobe of the signal (see, e.g., FIGS. 4 and 11). The transmitting apparatus 1400 is thus capable of amplifying/transmitting the signal while suppressing electrical power leakage to adjacent channels.

In this manner, the transmitting apparatus 1400 according to the third embodiment is capable of transmitting a transmission signal whose nonlinear distortion by the amplifier 1408 is compensated accurately. For example, in mobile communication requiring large transmission power, such as W-CDMA, the transmitting apparatus 1400 accurately compensates nonlinear distortion arising on the transmission signal to prevent a leak of electrical power of the transmission signal to adjacent channels. Thus, when a wideband signal is used as the transmission signal, distortion near the transmission signal caused by a memory effect can be compensated accurately, improving communication quality.

As described above, according to the distortion compensating apparatus, the amplifying apparatus, the transmitting apparatus, and the distortion compensating method, signal distortion can be compensated accurately.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A distortion compensating apparatus that compensates signal distortion caused by an amplifier, comprising:
   a distortion compensating process unit that using a distortion compensation coefficient, compensates distortion of an input signal;
   a memory unit that stores therein the distortion compensation coefficient; and
   an address generating unit that generates a first address that is based on electrical power of the input signal and for acquiring the distortion compensation coefficient from the memory unit and that generates a second address that is based on a phase of the input signal and for acquiring the distortion compensation coefficient from the memory unit, wherein
   the distortion compensating process unit acquires the distortion compensation coefficient from the memory unit based on the first and the second addresses to compensate the distortion.

2. The distortion compensating apparatus according to claim 1, further comprising a calculating unit that calculates the distortion compensation coefficient, based on the input signal not yet subjected to distortion compensation and an output signal from the amplifier, wherein
   the memory unit stores therein associated with the first and the second addresses, the distortion compensation coefficient calculated by the calculating unit.

3. The distortion compensating apparatus according to claim 1, wherein
   the address generating unit includes a phase calculating unit that calculates phase of the input signal, and
   the address generating unit generates the second address based on a difference between the phase calculated by the phase calculating unit and that consequent to delaying the calculated phase by a given time.

4. The distortion compensating apparatus according to claim 1, wherein
   the address generating unit generates the first address based on an amplitude calculated from the electrical power.

5. The distortion compensating apparatus according to claim 1, wherein
   the address generating unit generates the first address based on a logarithmic value of the electrical power.

6. The distortion compensating apparatus according to claim 1, wherein
   the address generating unit generates a third address for acquiring the distortion compensation coefficient from the memory unit, based on the electrical power of the input signal, and
   the distortion compensating process unit compensates the distortion of the input signal using the distortion compensation coefficient acquired from the memory unit based on the first, the second, and the third addresses.

7. The distortion compensating apparatus according to claim 6, wherein
   the memory unit stores, associated with the first, the second, and the third addresses, the distortion compensation coefficient calculated by the calculating unit.

8. The distortion compensating apparatus according to claim 6, wherein
   the address generating unit includes an amplitude calculating unit that calculates an amplitude based on the electrical power of the input signal, and
   the address generating unit generates the third address based on a difference between the amplitude calculated by the amplitude calculating unit and that consequent to delaying the calculated amplitude by a given time.

9. The distortion compensating apparatus according to claim 6, wherein
   the address generating unit includes a power calculating unit that calculates the electrical power of the input signal, and
   the address generating unit generates the third address based on a difference between the electrical power calculated by the power calculating unit and that consequent to delaying the calculated electrical power by a given time.

10. The distortion compensating apparatus according to claim 6, wherein
    the address generating unit includes a logarithmic electrical power calculating unit that calculates a logarithmic value of the electrical power of the input signal, and
    the address generating unit generates the third address based on a difference between the logarithmic value calculated by the logarithmic electrical power calculating unit and that consequent to delaying the calculated logarithmic value by a given time.

11. An amplifying apparatus comprising:
    the distortion compensating apparatus according to claim 1;
    the amplifier; and
    a feedback line that feeds a signal output from the amplifier back to the distortion compensating apparatus, wherein
    the distortion compensating apparatus further includes a calculating unit that calculates the distortion compensation coefficient based on the input signal not yet subjected to the distortion compensation and an output signal fed back through the feedback line, and
    the memory unit stores, associated with the first and the second addresses, the distortion compensation coefficient calculated by the calculating unit.

12. A transmitting apparatus comprising:
    the amplifying apparatus according to claim 11; and
    a transmitting unit that transmits a signal that has been amplified by the amplifying apparatus.

13. A distortion compensating method of compensating signal distortion caused by an amplifier, comprising:
    compensating distortion of an input signal, by using a distortion compensation coefficient;
    storing in a memory unit, the distortion compensation coefficient;
    generating a first address that is based on electrical power of the input signal and for acquiring the distortion compensation coefficient from the memory unit; and
    generating a second address that is based on a phase of the input signal and for acquiring the distortion compensation coefficient from the memory unit, wherein
    the compensating includes acquiring the distortion compensation coefficient from the memory unit based on the first and the second addresses.

* * * * *